United States Patent
Basker et al.

(10) Patent No.: US 9,941,378 B2
(45) Date of Patent: Apr. 10, 2018

(54) AIR-GAP TOP SPACER AND SELF-ALIGNED METAL GATE FOR VERTICAL FETS

(71) Applicant: INTERNATIONAL BUSINESS MACHINES CORPORATION, Armonk, NY (US)

(72) Inventors: Veeraraghavan S. Basker, Schenectady, NY (US); Kangguo Cheng, Schenectady, NY (US); Theodorus E. Standaert, Clifton Park, NY (US); Junli Wang, Slingerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/624,061

(22) Filed: Jun. 15, 2017

(65) Prior Publication Data

US 2017/0330951 A1    Nov. 16, 2017

Related U.S. Application Data

(63) Continuation of application No. 15/152,144, filed on May 11, 2016, now Pat. No. 9,735,246.

(51) Int. Cl.
| | |
|---|---|
| *H01L 29/66* | (2006.01) |
| *H01L 29/788* | (2006.01) |
| *H01L 21/02* | (2006.01) |
| *H01L 29/49* | (2006.01) |
| *H01L 29/78* | (2006.01) |

(52) U.S. Cl.
CPC .... *H01L 29/4991* (2013.01); *H01L 29/66666* (2013.01); *H01L 29/7827* (2013.01)

(58) Field of Classification Search
CPC ......... H01L 29/4991; H01L 29/66666; H01L 29/7827
USPC ........................................................ 257/329
See application file for complete search history.

(56) References Cited

U.S. PATENT DOCUMENTS

| | | | |
|---|---|---|---|
| 6,001,695 A * | 12/1999 | Wu ................ | H01L 29/4983 257/340 |
| 6,238,987 B1 * | 5/2001 | Lee ................ | H01L 29/4966 257/E29.16 |
| 8,637,384 B2 | 1/2014 | Ando et al. | |
| 8,637,930 B2 | 1/2014 | Ando et al. | |
| 8,999,837 B2 | 4/2015 | Park et al. | |

(Continued)

FOREIGN PATENT DOCUMENTS

KR    1020150053020    5/2015

OTHER PUBLICATIONS

Office Action issued in U.S. Appl. No. 15/471,416 dated Oct. 20, 2017, pp. 1-9.

(Continued)

*Primary Examiner* — Dzung Tran
(74) *Attorney, Agent, or Firm* — Tutunjian & Bitetto, P.C.; Vazken Alexanian

(57) ABSTRACT

Methods for forming a transistor include forming a gate conductor in contact with a gate stack. The gate conductor has a top surface that meets a middle point of sidewalls of a sacrificial region of a fin. The sacrificial region of the fin is trimmed to create gaps above the gate stack. A top spacer is formed on the gate conductor. The top spacer includes airgaps above the gate stack.

9 Claims, 6 Drawing Sheets

(56) References Cited

U.S. PATENT DOCUMENTS

| | | |
|---|---|---|
| 9,024,383 B2 | 5/2015 | Gamerith et al. |
| 9,368,572 B1 | 6/2016 | Cheng et al. |
| 9,443,982 B1 | 9/2016 | Balakrishnan et al. |
| 2013/0093019 A1* | 4/2013 | Ando .................... H01L 29/785 257/347 |
| 2014/0327054 A1* | 11/2014 | Adam ................. H01L 29/6656 257/288 |
| 2015/0263021 A1 | 9/2015 | Hwang et al. |
| 2016/0056084 A1 | 2/2016 | Davies |
| 2016/0104798 A1* | 4/2016 | Kim .................... H01L 29/7827 257/329 |

OTHER PUBLICATIONS

List of IBM Patents or Patent Applications Treated as Related dated Jun. 15, 2017, 2 pages.

* cited by examiner

AIR-GAP TOP SPACER AND SELF-ALIGNED METAL GATE FOR VERTICAL FETS

BACKGROUND

Technical Field

The present invention generally relates to semiconductor devices and, more particularly, to vertical fin field effect transistors.

Description of the Related Art

Vertical transistors employ channel regions that are oriented generally perpendicular to the plane of an underlying substrate—as opposed to conventional transistors which generally have channel regions that are a part of, or are otherwise parallel to, the underlying substrate. This orientation has significant potential for device scaling, more transistors can fit within a given chip surface area.

However, one challenge in forming a vertical transistor is in controlling the device's gate length. The gate length determines various properties of the final device, and conventional fabrication processes result in significant variation in gate length from one device to the next.

Another challenge is that a top spacer is generally used to separate the top source/drain region of the transistor from the gate. However, this creates a parasitic capacitance between the top source/drain region and the gate, which can impede device performance.

SUMMARY

A method for forming a transistor includes forming a gate conductor in contact with a gate stack. The gate conductor has a top surface that meets a middle point of sidewalls of a sacrificial region of a fin. The sacrificial region of the fin is trimmed to create gaps above the gate stack. A top spacer is formed on the gate conductor. The top spacer includes airgaps above the gate stack.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Embodiments of the present invention use an airgap spacer that is formed on top of a vertical transistor's channel region to decrease parasitic capacitance. The channel of the transistor is formed using a two-material fin, providing for precise control of the gate length while creating the airgap.

Figure 1:
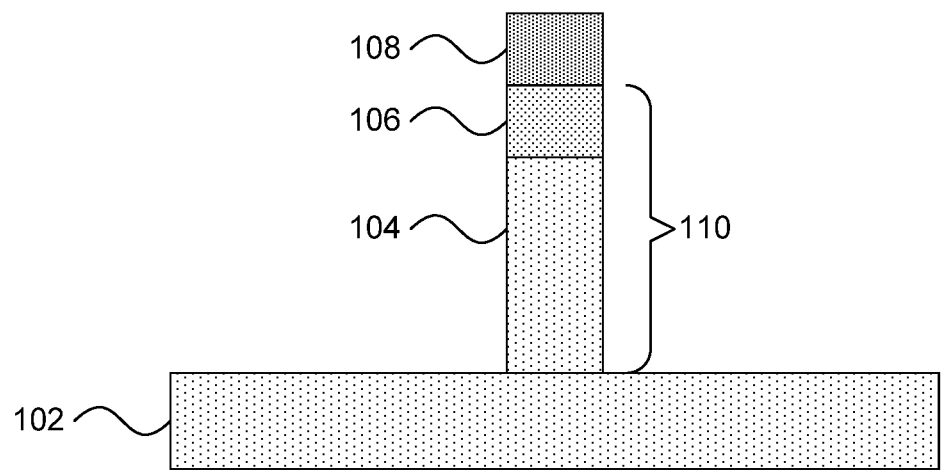
FIG. 1 is a cross-sectional diagram of a step in forming a vertical transistor in accordance with the present principles.

Referring now to FIG. 1, a step in forming a vertical transistor is shown. A semiconductor fin 110 is formed from on a substrate 102 from a layer of first semiconductor material 104 and a layer of second semiconductor material 106 using a hardmask 108 and an anisotropic etch, such as reactive ion etching (RIE). Although it is contemplated that the first layer of semiconductor material 104 may be formed from the same material as the semiconductor substrate 102, it should be understood that different materials may be used. In addition, the first semiconductor material and the second semiconductor material are different materials and can be etched selectively from one another.

In one embodiment, the semiconductor substrate 102 is formed from a bulk, silicon-containing material. Illustrative examples of silicon-containing materials suitable for the bulk-semiconductor substrate include, but are not limited to, silicon, silicon germanium, silicon carbide, silicon germanium carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted herein, the semiconductor substrate 102 may also be a semiconductor on insulator (SOI) substrate.

The layer of first semiconductor material 104 may therefore be any appropriate semiconductor channel material. In addition to the possibilities set forth above, the layer of first semiconductor material 104 may be formed from a III-V compound semiconductor material. The term "III-V compound semiconductor" denotes a semiconductor material that includes at least one element from Group III of the Periodic Table of Elements (International Union of Pure and Applied Chemistry (IUPAC) Group 13) and at least one element from Group V of the Periodic Table of Elements (IUPAC Group 15). Typically, the III-V compound semiconductors are binary, ternary or quaternary alloys including III/V elements. Examples of III-V compound semiconductors that can be used in the present invention include, but are not limited to alloys of gallium arsenic, aluminum arsenic, indium gallium arsenic, indium aluminum arsenic, indium aluminum arsenic antimony, indium aluminum arsenic phosphorus, indium gallium arsenic phosphorus and combinations thereof.

The layer of second semiconductor material 106 is formed directly on the layer of first semiconductor material and may be formed from any appropriate semiconductor material as listed above. It is specifically contemplated that the layer of first semiconductor material 104 may be silicon and that the layer of second semiconductor material may be silicon germanium.

A hardmask 108 is used to define the fin 110, with material outside that covered by the hardmask 108 being etched away as shown. It is specifically contemplated that this etch may be performed as part of a shallow trench isolation (STI) process, but it should be understood that other forms of anisotropic etching may be employed instead. As used herein, an "anisotropic etch process" denotes a material removal process in which the etch rate in the direction normal to the surface to be etched is greater than in the direction parallel to the surface to be etched.

STI regions are formed by etching a trench in the substrate utilizing a conventional dry etching process such as RIE or plasma etching. RIE is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation. Alternatively, fin structure 110 can be formed by spacer imaging transfer processes.

While it is specifically contemplated that the hardmask 108 may be formed from silicon nitride, it should be understood that alternative hardmask materials may include silicon oxides, silicon oxynitrides, silicon carbides, silicon carbonitrides, etc. Spin-on dielectrics may also be utilized as a hardmask material including, but not limited to: silsesquioxanes, siloxanes, and boron phosphate silicate glass (BPSG). The hardmask 108 may be patterned using photolithographic processes, where the hardmask 108 may be produced by applying a photoresist layer to the semiconductor surface, exposing the photoresist layer to a pattern of radiation, and then developing the pattern into the photoresist layer utilizing conventional resist developer.

It should be noted that the substrate region 102 underneath the fin 110 operates as the bottom source/drain region for the device and will be referred to equivalently herein as either the "substrate" or the "bottom source/drain region." The substrate region 110 is therefore doped in accordance with the conductivity type of the device and may be in situ doped or may alternatively be doped by bombardment with a dopant species. As used herein, the term "conductivity type" denotes a dopant region being p-type or n-type. As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium. As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

In a first embodiment, dopant species may be implanted vertically. The hardmask 108 prevents dopant ions from entering the fin 110, and an optional sacrificial spacer may be deposited along the sidewalls of the fin 110 to further insulate the fin 110 from implantation. A thermal anneal is then used to activate the dopant. In a second embodiment, a sacrificial spacer may be used before a source/drain region recess is performed, followed by epitaxial growth of source/drain regions with in situ doping. In a third embodiment, the substrate 102 may be grown with in situ doping prior to patterning the layer of first semiconductor material 104. In this third embodiment, a doped epitaxial growth is used to form the layer that becomes substrate 102, followed by an undoped epitaxial growth step to form the layer that will later become the layer of first semiconductor material 104. The depth of the bottom source/drain region may be about 10 nm to about 50 nm deep.

Figure 2:
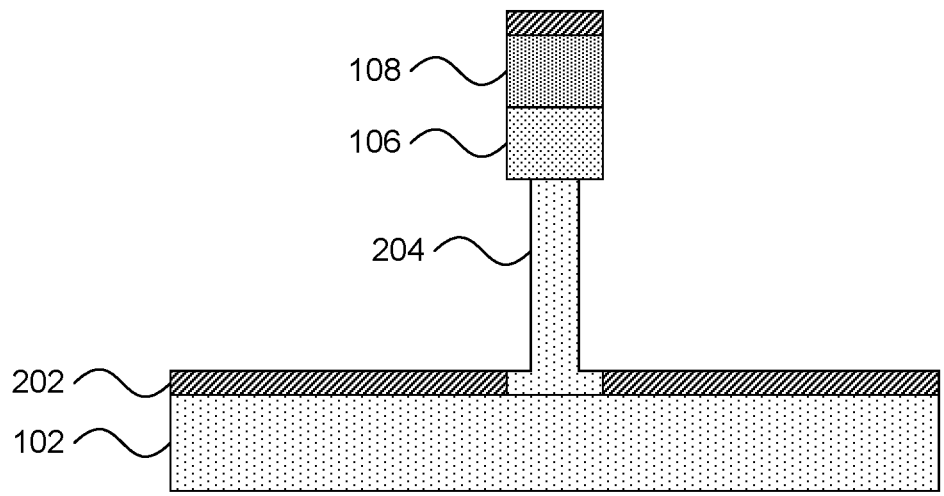
FIG. 2 is a cross-sectional diagram of a step in forming a vertical transistor in accordance with the present principles.

Referring now to FIG. 2, a step in forming a vertical transistor is shown. A bottom spacer 202 is deposited over the horizontal surfaces using a directional deposition such as, e.g., high-density plasma CVD (HDPCVD) or physical vapor deposition (PVD). It is specifically contemplated that silicon nitride, silicon oxide or a combination of silicon oxide and silicon nitride may be used as the bottom spacer, but any appropriate dielectric material may be used in its place. The bottom spacer 202 is used to insulate the bottom source/drain region of the substrate 102 from the gate conductor that will be deposited later.

Although HDPCVD is specifically contemplated, it should be understood that physical vapor deposition (PVC) or gas cluster ion beam (GCIB) deposition may be used instead. In embodiments that use PVD, a sputtering apparatus may include direct-current diode systems, radio frequency sputtering, magnetron sputtering, or ionized metal plasma sputtering. In embodiments that use GCIB deposition, a high-pressure gas is allowed to expand in a vacuum, subsequently condensing into clusters. The clusters can be ionized and directed onto a surface, providing a highly anisotropic deposition.

The layer of first semiconductor material 104 is laterally etched, narrowing to form channel fin 204. The lateral trim of layer 104 may be performed using an isotropic etch such as an isotropic silicon RIE that selectively removes the channel material of the layer 104 and does not affect silicon nitride, silicon dioxide, or other dielectrics that may be present.

Figure 3:
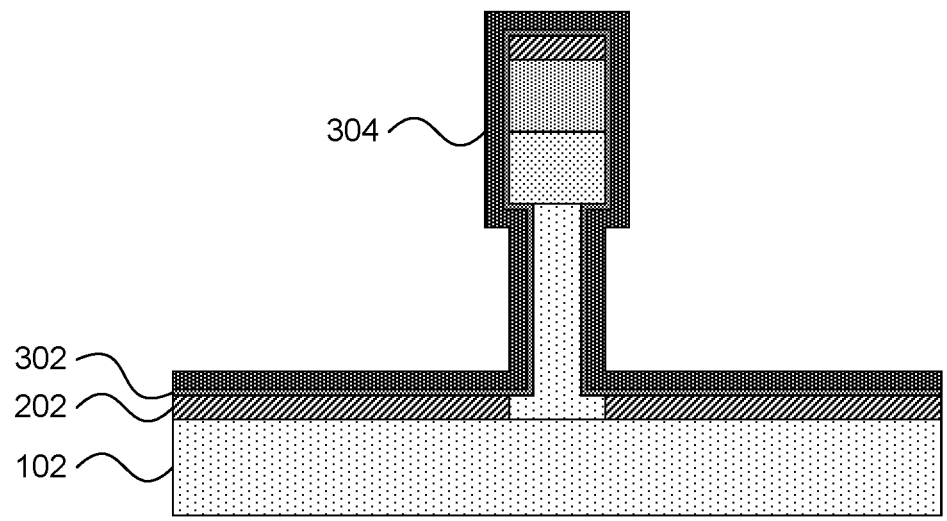
FIG. 3 is a cross-sectional diagram of a step in forming a vertical transistor in accordance with the present principles.

Referring now to FIG. 3, a step in forming a vertical transistor is shown. A gate dielectric layer 302 is conformally formed on the vertical channel fin 204 as well as the layer of second semiconductor material 106 and the hardmask 108. It is specifically contemplated that the gate dielectric layer 302 may be formed from a high-k dielectric, which is a material having a dielectric constant k that is higher than that of silicon dioxide. A gate material layer 304 is deposited over the gate dielectric layer 302. It is specifically contemplated that the gate material layer 304 may be formed from a work function metal layer. The gate dielectric layer 302 and the gate material layer 304 together form a gate stack and may include any other layers appropriate to the stack. It is specifically contemplated that the gate dielectric layer 302 and the gate material layer 304 are deposited using an isotropic deposition process such as chemical vapor deposition (CVD).

It should be understood that, although CVD is specifically contemplated for deposition of the gate dielectric layer 302 and the gate material layer 304, PVD, ALD, or GCIB deposition may be used instead. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed.

It is specifically contemplated that the gate dielectric layer 302 may be formed from an oxide of hafnium, but it should be understood that any appropriate high-k dielectric may be used, with examples including oxides of tantalum, zirconium, or aluminum.

In the case of a p-type device, the work function metal layer effectuates a p-type threshold voltage shift. In one embodiment, the work function of the p-type work function metal layer ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the Fermi energy of a p-type semiconductor device towards a valence band of silicon in the silicon containing material of the p-type semiconductor device. A "valence band" is the highest range of electron energies where electrons are normally present at absolute zero.

In one embodiment, the p-type work function metal layer may be composed of titanium and its nitride/carbide. In one specific embodiment, the p-type work function metal layer is composed of titanium nitride. The p-type work function metal layer may also be composed of titanium aluminum nitride, ruthenium, platinum, molybdenum, cobalt, and alloys and combinations thereof.

In an n-type device, the work function metal layer effectuates an n-type threshold voltage shift. As used herein, an "n-type work function metal layer" is a metal layer that effectuates an n-type threshold voltage shift. "N-type threshold voltage shift" as used herein means a shift in the Fermi energy of an n-type semiconductor device towards a conduction band of silicon in a silicon-containing material of the n-type semiconductor device. The "conduction band" is the lowest lying electron energy band of the doped material that is not completely filled with electrons. In one embodiment, the work function of the n-type work function metal layer ranges from 4.1 eV to 4.3 eV. In one embodiment, the n-type work function metal layer is composed of at least one of titanium aluminum, tantalum nitride, titanium nitride, hafnium nitride, hafnium silicon, or combinations thereof.

Figure 4:
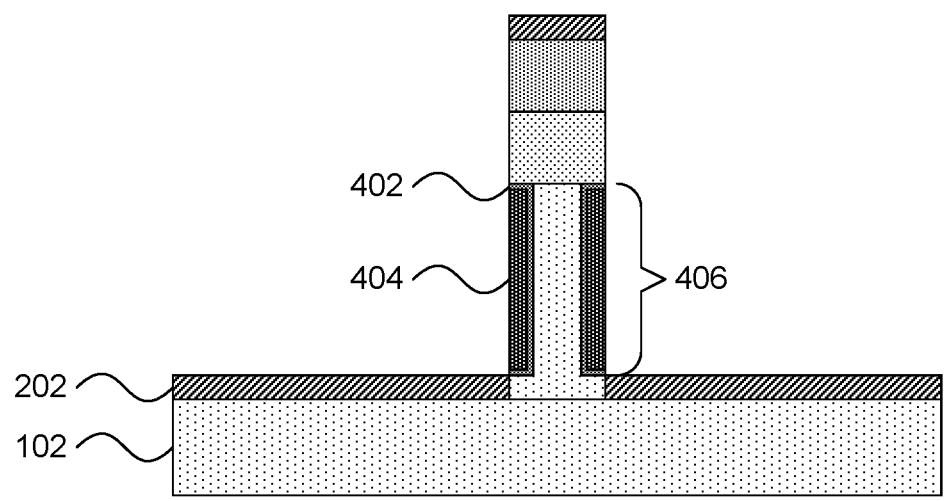
FIG. 4 is a cross-sectional diagram of a step in forming a vertical transistor in accordance with the present principles.

Referring now to FIG. 4, a step in forming a vertical transistor is shown. The gate stack 406 is formed from the portions of the gate dielectric layer 302 and the gate material layer 304 that are directly underneath the layer of second semiconductor material 106. The gate dielectric layer 302 and the gate material layer 304 are trimmed using an anisotropic etch that selectively removes these layers from all exposed surfaces, forming gate dielectric 402 and gate 404.

Figure 5:
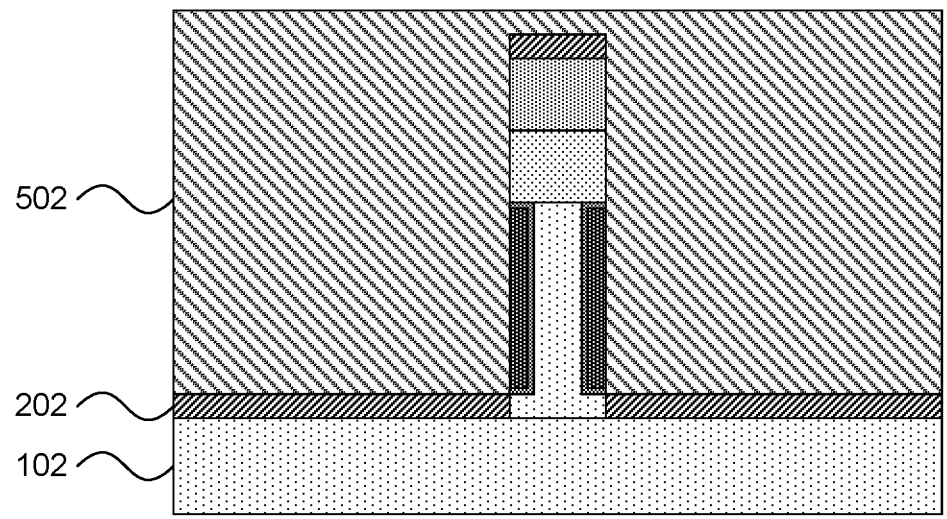
FIG. 5 is a cross-sectional diagram of a step in forming a vertical transistor in accordance with the present principles.

Referring now to FIG. 5, a step in forming a vertical transistor is shown. A conductor 502 is filled in around the transistor device. It is specifically contemplated that tungsten may be used as the conductor 502, but any appropriate conductive material may be used instead. The conductor 502 may be deposited using any appropriate deposition process including one of, e.g., CVD, PVD, ALD, or GCIB deposition.

Figure 6:
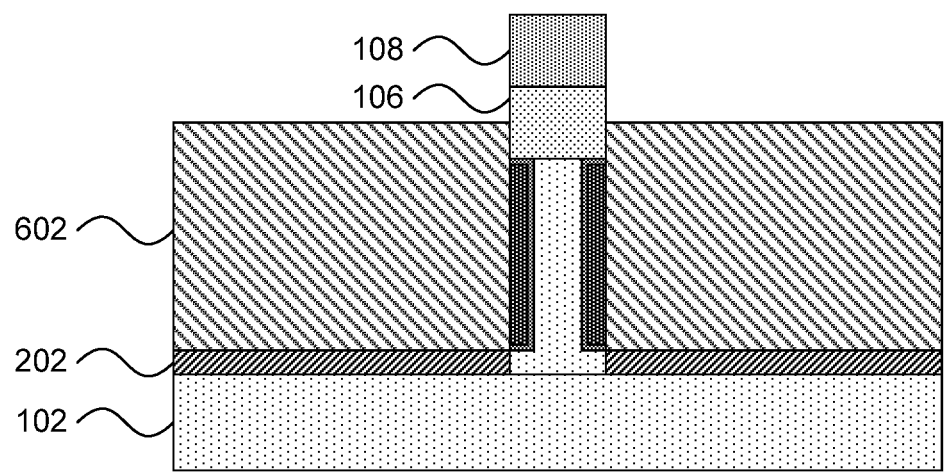
FIG. 6 is a cross-sectional diagram of a step in forming a vertical transistor in accordance with the present principles.

Referring now to FIG. 6, a step in forming a vertical transistor is shown. The conductor 502 is polished down to the level of the top of the hardmask 108 using, e.g., chemical mechanical planarization (CMP). A subsequent etchback is performed to further reduce the level of the conductor 502 below the height of the top surface of the second layer of semiconductor material 106, producing recessed conductor 602. If a portion of the bottom spacer material 202 remains on the hardmask 108, it is removed during the CMP step.

CMP is performed using, e.g., a chemical or granular slurry and mechanical force to gradually remove upper layers of the device. The slurry may be formulated to be unable to dissolve, for example, the hardmask material, resulting in the CMP process's inability to proceed any farther than that layer. The etchback process may include at timed anisotropic etch, such as RIE, and should expose at least a portion of the sidewalls of the layer of second semiconductor material 106 without exposing the channel fin 204.

Figure 7:
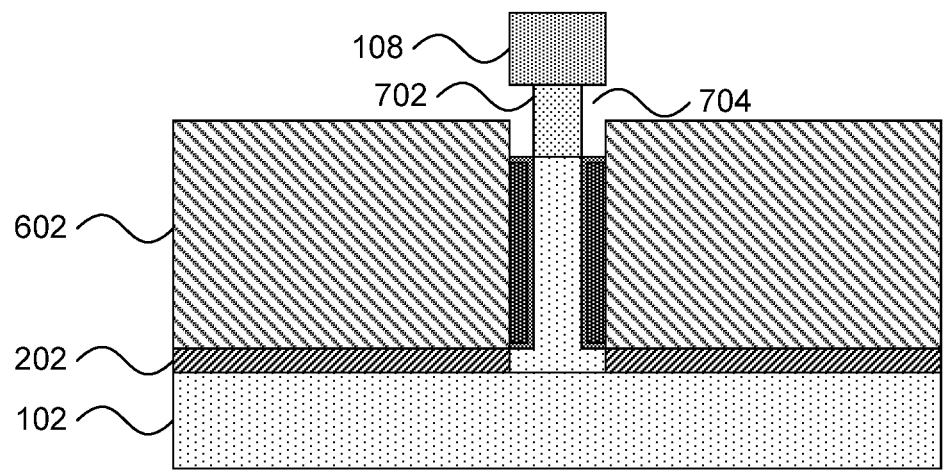
FIG. 7 is a cross-sectional diagram of a step in forming a vertical transistor in accordance with the present principles.

Referring now to FIG. 7, a step in forming a vertical transistor is shown. The layer of second semiconductor material 106 is trimmed using an isotropic wet or dry etch that is selective to the second semiconductor material and does not affect the recessed conductor 602, the hardmask 108, or the gate dielectric 402, producing the trimmed portion 702. It should be noted that the trim of the layer of second semiconductor material is timed such that the trimmed portion 702 has roughly a same width as a width of the channel fin 204 beneath it, or slightly larger, to improve its resistance. The trim creates a gap 704 that exposes the top surface of the gate dielectric 402.

Figure 8:
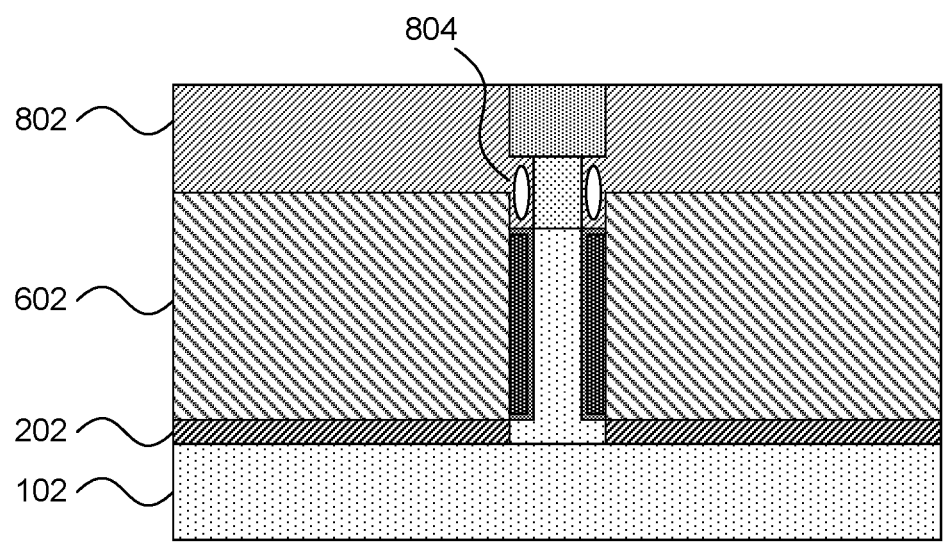
FIG. 8 is a cross-sectional diagram of a step in forming a vertical transistor in accordance with the present principles.

Referring now to FIG. 8, a step in forming a vertical transistor is shown. A top spacer 802 is formed on the recessed conductor 602. The top spacer 802 has airgaps 804 in the region that fills the gap 704. In one embodiment, the top spacer 802 is formed from a single dielectric material. In a second embodiment, the top spacer is formed with a first dielectric layer followed by a second layer formed from a dielectric having a lower dielectric constant k than the first dielectric layer. Deposition of the top spacer 802 is performed using, e.g., HDPCVD, PECVD, or any non-conformal dielectric film deposition process. Any non-conformal process will create airgaps 804 in the top spacer 802.

Figure 9:
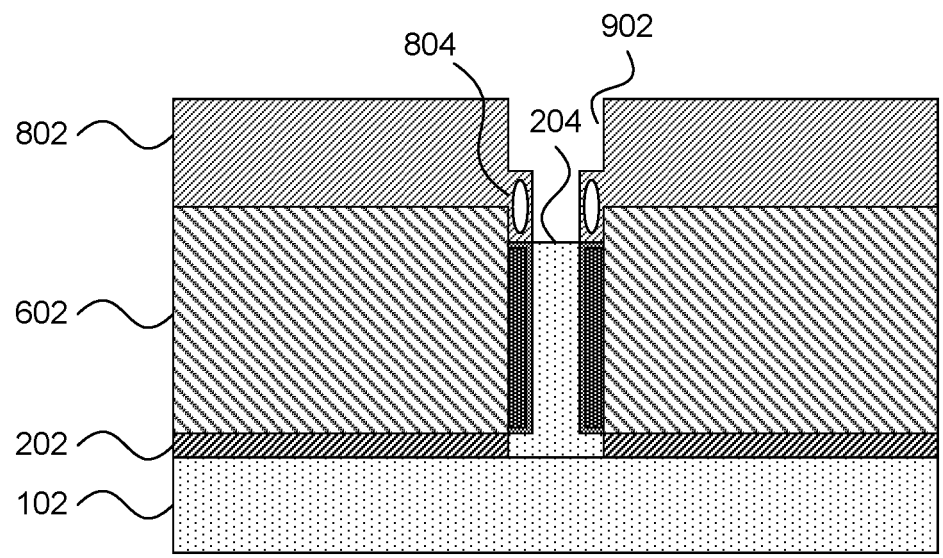
FIG. 9 is a cross-sectional diagram of a step in forming a vertical transistor in accordance with the present principles.

Referring now to FIG. 9, a step in forming a vertical transistor is shown. In one embodiment, the trimmed portion 702 and the hardmask 108 are etched away using any appropriate etch, including a wet or dry isotropic etch or an anisotropic etch, that selectively removes the second semiconductor material without affecting the first semiconductor material of the channel fin 204. A gap 902 is formed that exposes the top surface of the channel fin 204.

The exposed portion of the fin 204 may be doped by ion bombardment. Optional implantation of a shallow layer of the top portion of the channel fin 204 is performed to improve the electrical junction with the subsequently formed top source/drain region.

Figure 10:
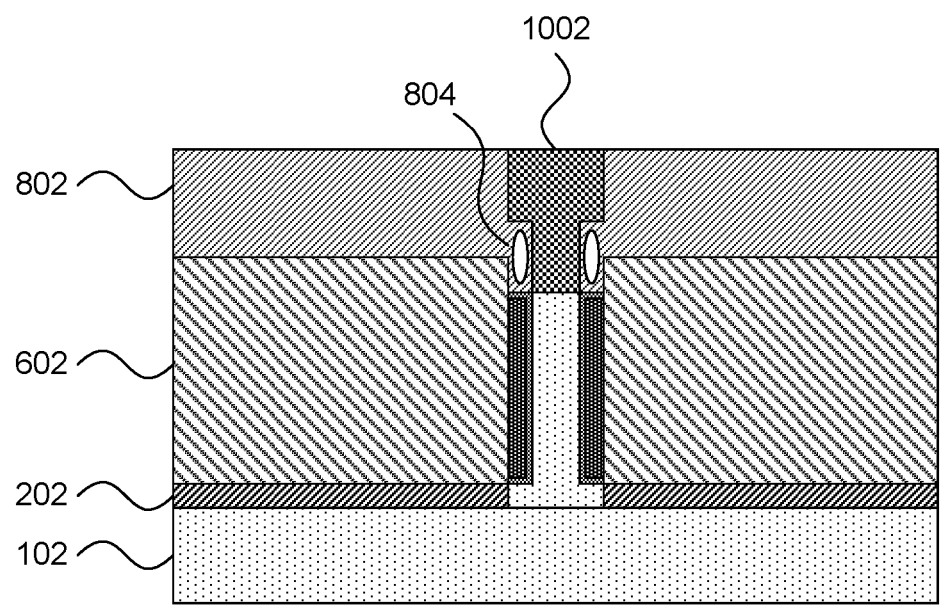
FIG. 10 is a cross-sectional diagram of a step in forming a vertical transistor in accordance with the present principles.

Referring now to FIG. 10, a step in forming a vertical transistor is shown. A top source/drain region 1002 is formed on the channel fin 204, in the gap 902. It is specifically contemplated that the top source/drain region 1002 may be epitaxially grown from the channel fin 204. In an alternative embodiment, where the trimmed portion 702 is not etched away, the top source/drain region 1002 may be grown from the trimmed portion 702. The top source/drain region 1002 may be doped in situ or via an implantation process.

The terms "epitaxial growth and/or deposition" means the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

In some embodiments, in which the epitaxial semiconductor material of the top source/drain region 1002 is composed of silicon, the silicon gas source for epitaxial deposition may be selected from the group consisting of hexachlorodisilane, tetrachlorosilane, dichlorosilane, trichlorosilane, methylsilane, dimethylsilane, ethylsilane, methyldisilane, dimethyldisilane, hexamethyldisilane, and combinations thereof. In some embodiments, in which the epitaxial semiconductor material of the top source/drain region 1002 is composed of germanium, the germanium gas source for epitaxial deposition may be selected from the group consisting of germane, digermane, halogermane, dichlorogermane, trichlorogermane, tetrachlorogermane, and combinations thereof. In some embodiments, in which the epitaxial semiconductor material of the top source/drain region 1002 is composed of silicon germanium, the silicon sources for epitaxial deposition may be selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane, and combinations thereof, and the germanium gas sources may be selected from the group consisting of germane, digermane, halogermane, dichlorogermane, trichlorogermane, tetrachlorogermane and combinations thereof. The germanium content of the epitaxial layer of silicon germanium may range from 5% to 70%, by atomic weight %. In another embodiment, the germanium content of the epitaxial layer of silicon germanium may range from 10% to 40%.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 11:
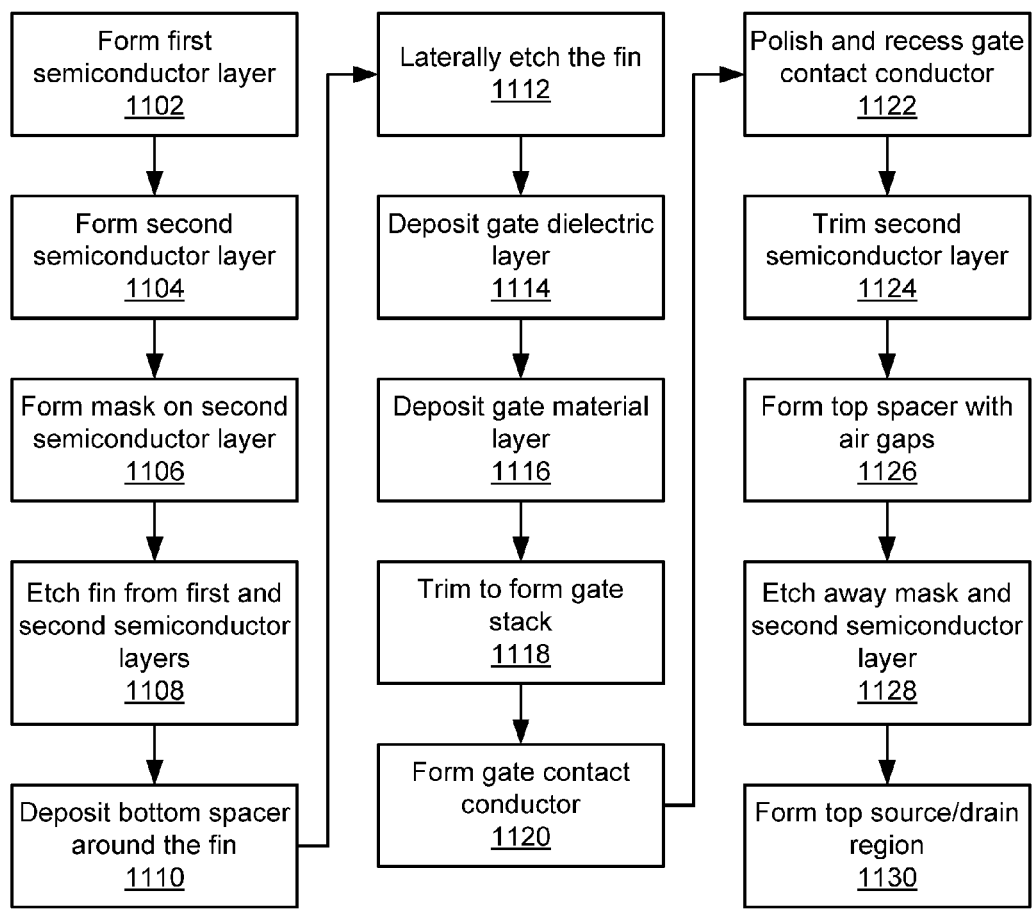
FIG. 11 is a block/flow diagram of a method for forming a vertical transistor in accordance with the present principles.

Referring now to FIG. 11, a method for fabricating a vertical transistor is shown. Block 1102 forms a layer of first semiconductor material and block 1104 forms a layer of second semiconductor material. Block 1106 forms a mask 108 on the layer of second semiconductor material. As noted above, the mask 108 defines a fin region, and block 1108 etches the fin 110 from the layers of semiconductor material, leaving bottom source/drain region 102. It should be noted that the first semiconductor material may be doped prior to formation of the fin 110 or, alternatively, the bottom source/drain region 102 may be doped by implantation after forming the fin 110.

Block 1110 deposits the bottom spacer layer 202 on the bottom source/drain region 102 around the fin 110. The fin 110 is then laterally etched to form trimmed channel fin 204 in block 1112. Block 1114 deposits gate dielectric layer 302 using a conformal deposition process such as, e.g., CVD. Block 1116 then forms the gate material layer 304 from an appropriate material such as a work function metal. Any material from the gate dielectric layer 302 and the gate material layer 304 that is not protected by the layer of second semiconductor material 106 are then etched away in block 1118, leaving a gate stack 406 of precise length.

Block 1120 deposits a gate contact conductor material 502 such as tungsten and block 1122 polishes and etches the gate contact conductor material down below the top level of the second layer of semiconductor material 106. Block 1124 trims the layer of second semiconductor material 106 to form trimmed portion 702, with gaps 704 above the gate stack 406. Block 1126 then deposits the top spacer 802 with airgaps 804 over the gate stack 406.

Block 1128 etches away the mask 108 and the trimmed portion 702 to create gap 902 and to expose the top surface of the channel fin 204. Block 1130 then epitaxially grows the top source/drain region 1002 from the top surface of the channel fin 204. It is specifically contemplated that the top source/drain region 1002 may be in situ doped during the growth process, but in an alternative embodiment the top source/drain region may be doped by an implantation process.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a transistor, comprising:
   forming a gate conductor in contact with a gate stack, the gate conductor having a top surface that meets a middle point of sidewalls of a sacrificial region of a fin;
   trimming the sacrificial region of the fin to create gaps above the gate stack; and
   forming a top spacer on the gate conductor, the top spacer including airgaps above the gate stack.

2. The method of claim 1, further comprising forming the fin on a bottom source/drain region and forming a top source/drain region directly on a top surface of the channel region after forming the top spacer.

3. The method of claim 2, wherein forming the fin comprises etching a stack comprising a first layer of a first semiconductor material and a second layer of a second semiconductor material to form a channel layer from the first semiconductor material and to form the sacrificial region from the second semiconductor material.

4. The method of claim 3, wherein the first semiconductor material is silicon and the second semiconductor material is silicon germanium.

5. The method of claim 3, further comprising forming a bottom spacer directly on the bottom source/drain region around the fin.

6. The method of claim 3, wherein forming the fin further comprises laterally etching the channel layer to form the channel region, such that the sacrificial region overhangs sidewalls of the channel region.

7. The method of claim 1, wherein trimming the sacrificial region comprises trimming the sacrificial region to a same width as a channel region of the fin.

8. The method of claim 1, wherein forming the top spacer comprises a non-conformal dielectric deposition process.

9. The method of claim 1, wherein forming the top spacer comprises forming a first dielectric layer and forming a second dielectric layer having a lower dielectric constant than the first dielectric layer.

* * * * *